United States Patent [19]
Novak

[11] Patent Number: 4,648,106
[45] Date of Patent: Mar. 3, 1987

[54] GAS CONTROL FOR X-RAY LITHOGRAPHIC SYSTEM

[75] Inventor: W. Thomas Novak, San Jose, Calif.

[73] Assignee: Micronix Corporation, Los Gatos, Calif.

[21] Appl. No.: 673,964

[22] Filed: Nov. 21, 1984

[51] Int. Cl.⁴ .............................................. G21K 5/00
[52] U.S. Cl. ....................................... 378/34; 378/35
[58] Field of Search ................. 378/34, 35; 250/492.1, 250/492.2

[56] References Cited

U.S. PATENT DOCUMENTS

| | | | |
|---|---|---|---|
| 4,085,329 | 4/1978 | McCoy et al. | 250/492.2 |
| 4,185,202 | 1/1980 | Dean et al. | 378/34 |
| 4,453,262 | 6/1984 | Buckley | 378/34 |
| 4,516,254 | 5/1985 | Komeyama et al. | 378/35 |

Primary Examiner—Graig E. Church
Assistant Examiner—David P. Porta
Attorney, Agent, or Firm—Thomas S. MacDonald; Alan H. MacPherson; Steven F. Caserza

[57] ABSTRACT

A controlled flow of X-ray attenuating gas such as helium is provided to an upper portion of a beam exposure chamber. A vent tube (21) extends from a lower portion of the chamber adjacent a mask to an exterior exit orifice (23) positioned at mask level to prevent ingress of air to the chamber and prevent mask membrane deflecton and change in the mask-to-silicon wafer substrate gap distance. The substrate (20) is positioned below the mask membrane and is surrounded by a mask-to-wafer zone into which is flowed a substrate fabrication process gas which is vented either by a gas flange (25) in spaced gapped relation to the mask holder and mask, or by a vent tube (46) extending from the zone to an orifice end (46a) approximate the level of the mask. There is then no pressure differential on the top and bottom surfaces of the mask membrane affecting the mask-to-wafer gap distance (8) during substrate fabrication operations.

11 Claims, 4 Drawing Figures

GAS CONTROL FOR X-RAY LITHOGRAPHIC SYSTEM

CROSS-REFERENCES TO RELATED APPLICATIONS

This invention relates to and may be utilized in the lithographic system disclosed in U.S. application Ser. No. 487,943 filed Apr. 25, 1983 entitled "Lithographic System" by W. Thomas Novak, Inventor; and U.S. application Ser. No. 475,427 filed Mar. 15, 1983 entitled "Mask Alignment Apparatus" by Anwar Husain, Inventor. The disclosure of such applications are herein incorporated by reference.

BACKGROUND OF THE INVENTION

1. Field of the Invention

This invention relates to a lithographic alignment system particularly one usable in a system employing X-ray or other beams for printing replicas of patterns or masks on photo sensitive materials contained on semiconductor substrates such as silicon wafers, wherein the inert gas between the X-ray source and mask and the wafer fabrication process gas between the mask and wafer are controlled in terms of purity attenuation, oxygen content and leakage losses, and in pressurization levels affecting the mask-to-wafer gap.

2. Description of the Prior Art

U.S. Pat. No. 4,185,202 discloses as prior art an X-ray lithography system involving an X-ray source, an X-ray transmission chamber 14 and an imaging or exposing chamber 18 into which a prealigned mask-wafer fixture is moved into position under the source at the bottom of the exposing chamber for each exposure. The transmission chamber is maintained in a vacuum at a pressure less than about $10^{-6}$ torr while helium is present in the imaging or exposure chamber or a $10^{-2}$ torr vacuum provided which limits the throughout capabilities of the system. The improvement in the '202 patent is directed to having a movable (expandable) exposure chamber 40 with a side wall 46 which is lowered to engage the mask-wafer fixture. Helium is flowed into chamber 40 for each exposure at a rate of 10 liters/minute through passageway 42. A separate atmosphere of inert gas e.g. nitrogen at a rate of 2.9 liter/minute at a pressure of 5-50 psi is provided into the fixture and the zone between the mask underside and the wafer. Flushing of the zone is initially started while the fixture is still being loaded remote from the exposure chamber. The '202 patent also mentions that it may be advantageous to maintain the pressure in the exposure chamber greater than in the mask-to-wafer zone to prevent gaseous constituents in the latter being introduced to the former and contemplates addition of a small amount of inhibiting oxygen in the mask-to-wafer zone.

In the prior art the respective gases are both allowed to escape to the atmosphere in a relatively uncontrolled manner, typically the helium leaking profusely near the mask edge and exiting from the junction of the chamber and a bottom frame, and the process gas being injected in the vicinity of the wafer edge, in an attempt to maintain the proper gas environment and allowed to exit between the chuck and bottom frame.

SUMMARY

In an X-ray alignment apparatus, proper control of gas environments is essential for overall performance in two critical areas. The first relates to the helium gas between the X-ray exposure source and the X-ray mask, and the second relates to wafer fabrication process gases between the mask and the wafer which is being exposed. The problems arise due to several competing factors.

First, the purity of the helium in the exposure chamber must be kept high in order to reduce the X-ray exposure time to a minimum. A second factor is the need, in certain cases, to have a special wafer fabrication process gas in between the mask and the wafer. As an example, it may be desirable to have a gas mixture of about 0.3% oxygen in nitrogen present above the substrate resist for an optimum exposure. The oxygen in the gas reacts with the resist during exposure to obtain certain desirable printing characteristics.

A third factor is that the helium gas required is somewhat costly, and steps should be taken to minimize its use. This in turn improves the economic viability of the X-ray lithography system. A fourth factor is that due to the membrane nature of the X-ray mask, any differential pressure across the mask must be kept to a minimum. A pressure differential will cause the mask to deflect upward or downward, and therefore cause the mask-to-wafer gap to vary. This gap would also not be uniform across the wafer since the membrane would deflect more in its middle than at its supported peripheral edges and would introduce additional printing distortion. The allowable pressure difference is so small as to be not economically measurable by available sensors. However, the first two factors which have been mentioned tend to cause there to be two different gases on either side of the mask membrane.

The present invention is an improved X-ray lithographic system and substrate or wafer fabrication method in which the gases in the exposure chamber and in the abutting mask-to-wafer zone are controlled more exactingly and their usage significantly reduced. These advantages are realized by providing an inert gas vent tube adjacent to the bottom of the exposure chamber and of a design to prevent back diffusion from the surrounding exterior ambient and prevent mask membrane deflection. Further, the helium purity within the chamber can be continually monitored by providing an oxygen detector in the vent line. The present invention also provides an improved means for venting, sealing and controlling the pressure in the mask-to-wafer zone, including a gas flange interposed between a wafer-holding chuck and the mask holder, or in an alternative embodiment providing a vent tube for allowing a controlled purge of gas from the mask-to-wafer zone. This prevents contamination of that zone by ingress of ambient air without unduly pressurizing the underside of the mask membrane being acted upon on its top side by the helium or other inert gas in the X-ray exposure chamber. Providing an essential zero pressure differential across the mask membrane obviates any change in the gap distance between the mask membrane and the wafer.

DETAILED DESCRIPTION

Figure 1:
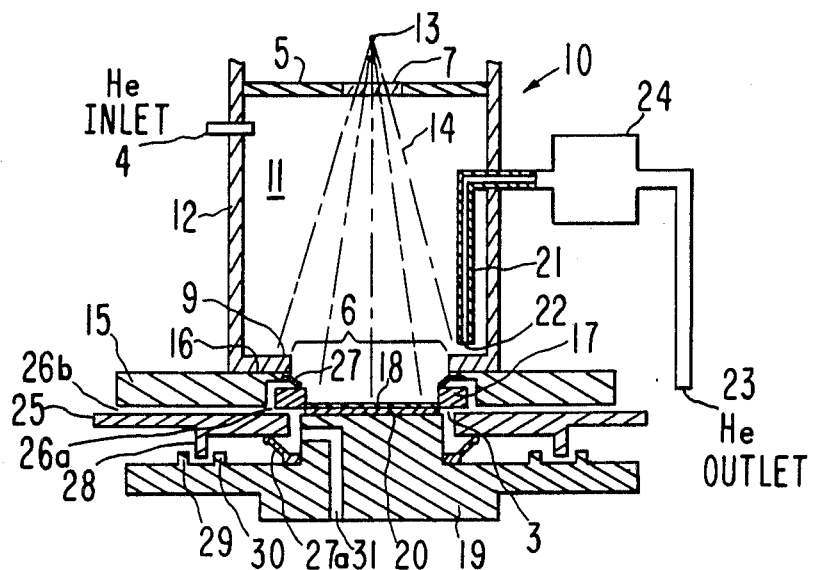
FIG. 1 is a partial side cross-sectional view of the X-ray system showing the gas control features.

An X-ray lithography system 10 incorporating the invention is seen in FIG. 1. An exposure chamber 11 is formed by cylindrical walls 12 and an inwardly extending bottom flange 9 forming an exit 6. X-rays, illustrated by rays 14 emanating from an X-ray source or target 13 in a source vacuum chamber, through a beryllium window 7 in an exposure chamber top closure 5. The particular design of the chamber 11 or the vacuum chamber containing source 13 is not critical to this invention other than the relationship of the exit and flange or other equivalent structure with the mask and mask holder, respectively.

A supply of helium or other gas which does not attenuate the transmission of X-rays enters chamber 11 through upper inlet 4 remote from the mask. The purity of the helium must be kept high to reduce the X-ray exposure time to a minimum and wafer printing production to a maximum. As an example, during transmission through a 25 cm thick column of helium, Al characteristic X-rays at 1.5 KeV are attenuated 5% given a helium purity of 99.90% and are attenuated 42% given a helium purity of 99.00%. The assumed contaminant would be air in each case. For Pd characteristic X-rays, the attenuation for the same two levels of helium purity would be about 1% and 7% respectively. The amount of helium gas used during wafer processing must be minimized from an economic standpoint.

A mask holder 15, typically of the type shown in the related application of Anwar Husain referenced above, abuts at a thick peripheral portion 16 with the underside of flange 9. A silicone rubber or other resilient soft seal (not shown) is placed between these surfaces to prevent ingress or egress of gases. A mask 17 having a relatively thin i.e. about 2 to 8 microns in thickness mask membrane 18, having the desired print pattern as is known in the art, is adjustingly held in a central aperture of the holder in the manner shown in the Husain application.

A wafer chuck 19 mounts on its top surface a semiconductor substrate or wafer 20 on which various electronic circuit patterns may be irradiated and fixed on a coating of X-ray resist material, as is known in the art. The wafer and mask membrane are accurately aligned with respect to each other, as set forth for example in the related Novak application, and gapped so as to be in parallel planes with a prescribed vertical gap therebetween typically of about 40 microns.

A helium vent tube 21 of reversed U-shaped configuration is provided within chamber 11 to prevent a pressure differential across mask membrane 18. The helium vents to the exterior of the chamber through the tube 21 at near the minimum velocity required to prevent back diffusion of oxygen or nitrogen molecules into the vent tube through end orifice 23. The tube and any orifices along it are the minimum diameter necessary to prevent any back flow or diffusion, but are not so small as to cause significant deflection of the membrane 18. Significant deflection would otherwise change or distort the gap distance between or across the mask membrane and the wafer and would result in mask-to-wafer registration errors. Typically, the maximum deflection allowed is in the range of 1 to 5 microns, depending on the criticality of the concerned wafer processing step.

Figure 4:
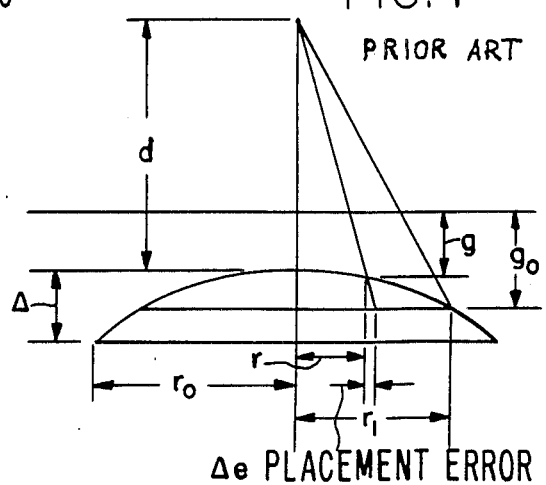
FIG. 4 is a prior art schematic showing placement error due to a parabolic gap between mask and wafer.

If both the mask and wafer are flat and can be positioned in parallel, all features on the mask will be faithfully positioned on the wafer. A gap dimension which varies across the wafer will cause runout-placement errors. The simplest non-flat shape to consider is the parabola shown in FIG. 4. The relation between the terms is $$\Delta e = \frac{r}{d} \cdot \frac{\Delta}{r_o^2} (r^2 - r_1^2)$$

Where, $\Delta/r_o^2$ is essentially the curvature of the gap, $\Delta$ is the height of the spherical dome whose base has radius $r_o$, assuming perfect placement of the alignment marks at radius $r_1$ and $\Delta e$ is the placement error incurred at radius $r$.

The curvature introduced by a pressure differential across a membrane is given by $\Delta/r_o^2 = P/(4St)$. For a typical initial stress, S, of $10^8$ dynes/cm$^2$, a thickness, t, of 4 $\mu$m, and a pressure differential, P, of 10 dyne/cm$^2$, then $\Delta/r_o^2 = 0.33$ $\mu$m/cm$^2$. For $r_o = 5.0$ cm, $\Delta$ then equals 8 microns. Letting $r_1 = 3.0$ cm, the maximum error in alignment ($\Delta e$) is then 0.08 microns, which is an acceptable value for wafer diameters of 10 cm.

The helium gas is introduced at the top of the chamber through inlet 4 and since the gas has a lower density than the air or air contaminated helium, the contaminated gas tends to settle downward toward the bottom of the chamber. Therefore, the interior end 22 of the vent tube 21 is as close as possible to the mask membrane surface 18, or the lowest point in the chamber (if lower than the mask). Thus the most contaminated gas is vented out of the chamber. A silicone rubber seal 27 at the top of the mask 17 is used to prevent helium contamination from the gases exterior to the mask. Since there is a density difference between helium and air, and since there must be zero pressure differential across the mask membrane, a slight positive pressure exists at all levels above the mask within the chamber. Because of this density difference, the exterior end or orifice 23 of the vent tube must be near or approximate the level of the mask surface. The vertical height of the end of the tube can be "tuned" to vary the pressure on the top side of the mask and hence to zero the differential across the mask by providing a screw threaded extension or sliding adjustable end on the tube end 23. This tuning phenomenon follows hydraulic principles common when dealing with liquids. The densities of N$_2$ (air) and helium at 0° C. and 760 torr are 1.25 grams/liter and 0.18 grams/liter respectively. The difference is $1.07 \times 10^{-3}$ grams/cm$^3$. Thus a 1 cm height change of the exterior end of the helium vent tube corresponds to a pressure change of $1.07 \times 10^{-3}$ grams/cm$^2$ or about 1 dyne/cm$^2$. Using this phenomenon, the pressure differential at the mask membrane (here assumed to be 10 dynes/cm$^2$) can be approximately compensated for by raising the exterior end of the tube 10 cm. This represents one of several means available for mask pressure compensation Along the tube 21 horizontal section exterior of the chamber 11 is a small chamber 24 containing an oxygen detector. This detector which can be a Model 320 AY manufactured by Teledyne Analytical Instruments is used to monitor the purity of the helium so that helium usage can be minimized. The height of tube 21 which can go up in direction or down is not critical. If the helium tube has an inside diameter of 6.0 mm, then the calculated flow rate, assuming a differential of 10 dynes/cm, is about 0.4 liters/minute. This corresponds to a helium velocity in the of 20 cm/sec. which is sufficient to prevent back-streaming (or back diffusion) of ambient air through orifice 23 to chamber 11.

The normal sequence is as follows: after the mask 17 has in holder 15 and is in place against the seal the helium is turned on at a relatively high flow rate typically about 8 liters/minute. When the purity reaches a preset value, a low helium flow of the order of 0.4 liters/minute is set to maintain this purity. If minor leakage is present or if greater pressure differential is allowed, the flow rate may be significantly higher, for example up to 4.0 liters/min. depending on the specific embodiment. An analog signal from the oxygen detector can be output and used by a service technician to optimize the low flow rate if required.

Thus the helium is vented to the atmosphere, but in such a manner as to minimize the helium use and contamination level. The helium pressure just above the mask membrane is adjusted relative to the pressure existing in the mask-to-wafer zone 3 to minimize the pressure differential between the top and bottom surfaces of the mask membrane.

Figure 2:
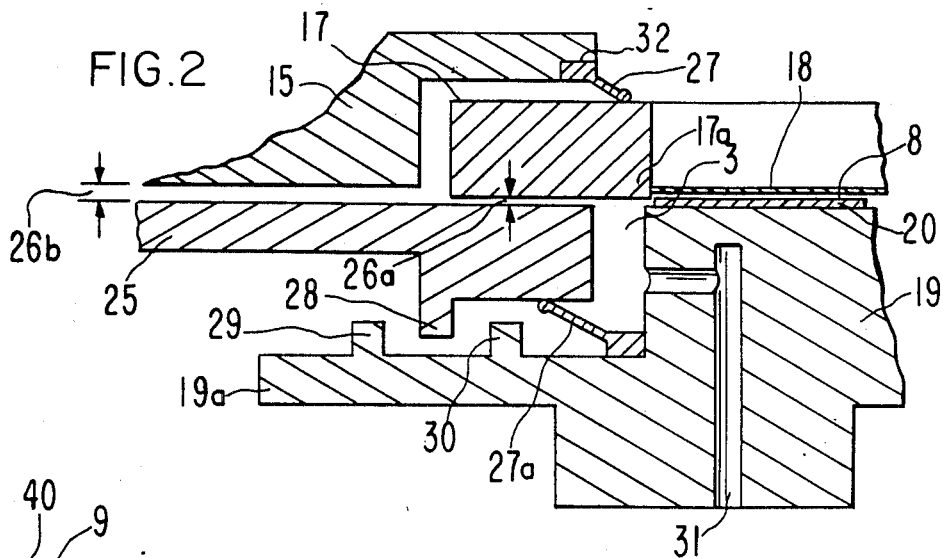
FIG. 2 is a magnified partial view of the left side of a gas flange means for controlling process gas flow in the mask-to-wafer zone.

Control of the pressure on the underside of membrane 18 in and around mask-to-wafer zone 3 is effected by various means. The gas used in this zone is termed a wafer fabrication process gas since it effects the printing quality on the semiconductor wafer. The process gas may be a nitrogen gas containing 0.3% oxygen, as taught by the U.S. Pat. No. 4,185,202. Process gas enters via the gas inlet 31 in chuck 19 to provide the proper atmosphere around the periphery of the wafer and in the mask-to-wafer gap in zone 3. A circular gas flange 25 is interposed between a peripheral extension 19a of chuck 19 and the underside of mask holder 15 leaving gaps 26a and 26b, respectively, therebetween. A silicone rubber seal 27a is used to prevent contaminating air passing through the gap between chuck 19a and gas flange 25 to zone 3. No seal can be placed between the gas flange and mask holder frame in gap 26b. Such a seal would endanger the pressure balance across the mask membrane. Instead, a long thin path indicated by 26b in the FIG. 2 is provided to allow the purging gas to escape to the outside, without a detectable pressure buildup affecting the mask membrane position i.e. preventing deflection. Gap 26b is of a value of about 10 to about 1000 microns. As in the case of the helium vent tube, to prevent contamination, the gas must flow at a rate which is faster than the back diffusion rate for air, and in this case, the flow must be sufficiently uniform so that no atmospheric contamination is drawn into the wafer zone during wafer exposure to the X-rays. Generally, a higher flow rate of about 5 liters/minute is used initially, as the wafer is being brought toward the mask. At this time, the gap is large between the mask and wafer, and the air, which is initially present, is swept away. The flow rate is reduced after the nominal mask-to-wafer gap is established to about 1.0±0.5 liters/minute. This technique becomes especially important in a step and repeat type alignment system where the atmosphere in the mask-to-wafer zone must be maintained during the step and repeat motion of the wafer relative to the mask by movement of the chuck on an alignment apparatus, such as shown in my prior related application.

Upstanding interdigitated embossments forming X-ray seals 28-30 extend in a circular pattern on facing surfaces of the chuck peripheral edge 19a and the gas flange providing a tortuous path which prevents stray X-rays from around the periphery of the mask or mask membrane exiting from the apparatus. The bottom of seal 28 is at a level below the top of seals 29 and 30 and seal 28 is positioned midway of the chuck seals 29 and 30. Circular seal 27a is inboard of the X-ray seals.

FIG. 2 shows a magnified cross-sectional view of the left side of FIG. 1 showing the placement of seals 27 and 27a and the relative size of the gaps between the various surfaces. With a mask-to-wafer gap of 40 microns the preferred gap spacing between the underside of mask holder 17 and the top of gas flange 25 is of the order of from 250 to 350 microns and gap 26b is of the order of 500 microns. The membrane 18 is affixed to a frame 17a of mask 17 for example as shown in the related Husain application. Frame 17a is sealed to holder 15 by the circular flexible seal 27.

The gap 26a around the periphery of the mask and wafer tends to restrict the flow of process gas into the ambient and therefore a small pressure differential may exist between the chamber area 3 and the ambient. This in turn will cause the mask membrane 18 to deflect downward due to the pressure differential that results across the membrane. Control of the process gas flows for a given gap 26a can therefore be used to compensate for the downward mask deflection which may result from the helium flow into the chamber 11 as described previously.

Therefore the complete tuning process is as follows. A tool or the system's optical alignment system can be used to measure the mask deflection from nominal. With the chamber 11 filled with helium and the volume 3 filled with process gas, using near normal, but uncalibrated flow rates, the flows are shut off to zero and the mask membrane 18 allowed to come to equilibrium. The sensor means used to measure the mask deflection is calibrated to zero. Next, the helium flow through inlet 4 is increased to that necessary to maintain the correct helium purity in the chamber 11. The process gas is then turned on and increased until any mask deflection is nulled. The process gas purity in volume 3 should be correct. The helium outlet 23 is fixed in the present embodiment at the mask membrane level.

In an alternative embodiment, (for example, where gap 26a is changed) if the process gas flow must be increased to a greater level for the reasons of purity and would cause net upward mask deflection, then the helium vent outlet can be lowered to compensate for the expected deflection. The reverse is also true. That is, the mask downward deflection caused by reducing the process gas flow can be compensated for by raising the end of the helium vent outlet. However, this solution may increase the demand on the integrity of the seals 27 and 16 since the net positive pressure across the seals will be reduced.

Figure 3:
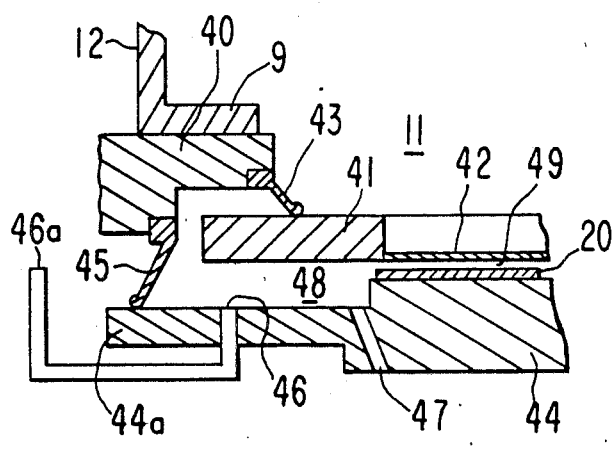
FIG. 3 is an alternative embodiment of a vent means for controlling process gas in that zone.

FIG. 3 illustrates an alternative embodiment (not designed for a step and repeat system) of the invention wherein the process gas pressure and purity is controlled by a circular silicone rubber seal 45 around the wafer and mask to prevent the influx of atmospheric gases into the mask-to-wafer zone 48 and a vent tube 46 is employed, similar to the helium vent tube described previously. This vent tube must have an exterior termination or end orifice 46a at the level of the mask. This is needed also, if there is any appreciable density difference between the process gas and ambient air, at the same pressure. This density difference will tend to promote vertical movement and may cause the gas containment and control problem to be more difficult depending on the mechanical design.

A mask holder 40 abuts the underside of flange 9 of cylinder 12. The mask 41 which may be attached to the holder as seen in the Husain related application is sealed thereto by a silicone rubber ring seal 43. The mask-to-wafer zone 48 is sealed by a circular silicone rubber ring seal 45 extending from the bottom of mask holder 40 to a peripheral flange 44a on chuck 44. Process gas enters through one or more inlets 47 around the periphery of chuck 44 adjacent to the wafer-holding central portion. Zone 48 extends in the gap 49 between mask membrane 42 and wafer 20 and around the periphery of wafer 20. Venting of the process gas is provided through vent tube 46 which extends upwardly to ambient air at orifice end 46a at a level equal or approximate to about the level of the mask membrane. In each of the embodiments the pressure on the top and bottom of the mask membrane are equal or of a differential not sufficient to cause significant membrane deflection or vibration.

While this invention has been described in terms of use in an X-ray lithographic system with an X-ray source it may be utilized with other types of beam printing apparatus such as those using an ion beam or deep ultraviolet source.

The above description of embodiments of this invention is intended to be illustrative and not limiting. Other embodiments of this invention will be obvious to those skilled in the art in view of the above disclosure.

I claim:

1. An X-ray lithographic system in which an X-ray mask including a patterned mask membrane is positioned in spaced alignment with a semiconductor wafer substrate having an X-ray sensitive resist material thereon, said system comprising an X-ray source, a chamber though which X-rays are passed to an exit therein to a patterned mask membrane sealing said exit, means for flowing a low X-ray-attenuation gas into said chamber at a pressure near the ambient surrounding the outside of the chamber and means for venting said gas from said chamber in a controlled manner such that the gas pressure at said mask prevents ingress of contaminating gas into said chamber and does not significantly deflect said mask membrane with respect to the semiconductor wafer substrate and the velocity of venting gas is sufficient to prevent back diffusion of contaminating gases into said chamber, said means for venting comprising an inverted U-shaped vent tube extending at a first end from a position in said chamber adjacent a bottom portion of said chamber upwardly to a position outwardly of said chamber, said tube then extending downwardly to a second end of said tube exterior of said chamber and terminating in an orifice at a level approximate the level of the mask membrane.

2. An X-ray lithographic system in which an X-ray mask including a patterned mask membrane is positioned in spaced alignment with a semiconductor wafer substrate having an X-ray sensitive resist material thereon, said system comprising an X-ray source, a chamber through which X-rays are passed to an exit therein to a patterned mask membrane sealing said exit, means for flowing a low X-ray-attenuation gas into said chamber at a pressure near the ambient surrounding the outside of the chamber and means for venting said gas from said chamber in a controlled manner such that the gas pressure at said mask prevents ingress of contaminating gas into said chamber and does not significantly deflect said mask membrane with respect to the semiconductor wafer substrate and the velocity of venting gas is sufficient to prevent back diffusion of contaminating gases into said chamber; and wherein said chamber is oriented vertically and in which said means for venting includes an inverted U-shaped vent tube extending first upwardly from said chamber to a position outwardly of said chamber, said tube then extending downwardly to an end orifice of said tube exterior of said chamber at a level approximate the level of the mask membrane.

3. The invention as set forth in claim 2 further including means for tuning the level of said end orifice to vary the pressure on a side of the patterned mask membrane facing said X-ray source and adjust pressure differentials across the patterned mask membrane.

4. The invention as set forth in claim 1 further comprising means for maintaining a process gas atmosphere in a zone surrounding a side of said mask membrane, facing away from said X-ray source, and said substrate to prevent ingress of contaminants and ambient atmosphere to said zone, said process gas atmosphere being at a gas pressure that does not significantly deflect said mask membrane with respect to said substrate.

5. An X-ray lithographic system in which an X-ray mask including a patterned mask membrane is positioned in spaced alignment with a semiconductor wafer substrate having an X-ray sensitive resist material thereon, said system comprising:

an X-ray source, a low attenuation chamber through which X-rays are passed to an exit therein to a patterned mask membrane sealing said exit;

means for flowing a low X-ray-attenuation gas into said chamber at a pressure near the ambient surrounding the outside of the chamber and means for venting said gas from said chamber in a controlled manner such that the gas pressure at said mask prevents ingress of contaminating gas into said chamber and does not significantly deflect said mask membrane with respect to the semiconductor wafer substrate and the velocity of venting gas is sufficient to prevent back diffusion of contaminating gases into said chamber;

means for maintaining a process gas atmosphere in a zone surrounding a side of said mask membrane, facing away from said X-ray source, and said substrate to prevent ingress of contaminants and ambient atmosphere to said zone, said process gas atmosphere being at a gas pressure that does not significantly deflect said mask membrane with respect to said substrate; and wherein said means for maintaining a process gas atmosphere includes a gas flange having a planar surface extending parallel to and spaced from said mask membrane and means for flowing a process gas into said zone and past said gas flange.

6. The invention as set forth in claim 5 in which said substrate is mounted on a chuck and wherein said gas flange is sealed by a flexible seal to said chuck and said mask includes a mask frame sealed by a flexible seal to a mask holder supporting said mask.

7. The invention as set forth in claim 6 in which said gas flange is spaced from said mask frame forming a gap extending peripherally around said gas flange, said gap having a height of from about 10 to about 1000 microns.

8. The invention as set forth in claim 6 in which said gas flange and said chuck includes interdigitated circular bosses to block transmission of stray X-rays.

9. The invention as set forth in claim 4 wherein said means for maintaining a process gas atmosphere includes means for flowing process gas into said zone and vent means extending from said zone to flow process gas exteriorly of said zone.

10. A method for fabricating a semiconductor substrate by irradiating the substrate by an X-ray source passing through an exposure chamber mounting a patterned mask at an exit of said chamber and wherein said substrate is mounted for fabrication in a fixedly spaced parallel plane exteriorly from said chamber and in alignment with said mask, said method comprising flowing a low X-ray attenuating gas into an upper portion of said chamber;

venting said gas from a lower portion of said chamber at a level adjacent to said mask, said gas having a slight positive pressure in said chamber adjacent said mask;

flowing said vented gas from said chamber for discharge at an exterior position level approximate the level of said mask; and tuning the exterior position level of gas venting discharge to minimize pressure differential across a top surface of said mask facing said chamber and a zone encompassing said substrate and a bottom surface of said mask spaced from and facing said substrate.

11. The method as set forth in claim 10 further comprising flowing a substrate fabrication process gas into said zone and venting said gas from said zone at a velocity to prevent ingress of contaminating gas to said zone and at a pressure to avoid deflection of said mask.

* * * * *